United States Patent
Shaikh et al.

(10) Patent No.: US 7,619,444 B1
(45) Date of Patent: Nov. 17, 2009

(54) CIRCUIT TECHNIQUE TO PREVENT DEVICE OVERSTRESS

(75) Inventors: Ashfaq R. Shaikh, San Jose, CA (US); Chang Hee Hong, Pleasanton, CA (US); Ting-Sheng Ku, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 615 days.

(21) Appl. No.: 11/299,080

(22) Filed: Dec. 8, 2005

(51) Int. Cl.
*H03K 19/0175* (2006.01)
*H03K 19/094* (2006.01)

(52) U.S. Cl. .......................... 326/81; 326/68; 327/309

(58) Field of Classification Search .................. 326/80, 326/82, 86, 87, 83; 327/333
See application file for complete search history.

(56) References Cited

U.S. PATENT DOCUMENTS 6,118,303 A * 9/2000 Schmitt et al. ................ 326/83
6,130,556 A * 10/2000 Schmitt et al. ................ 326/81
6,335,637 B1 * 1/2002 Correale et al. ............... 326/80
6,744,298 B2 * 6/2004 Yamauchi et al. ............ 327/333
7,002,379 B2 * 2/2006 Ajit ............................ 327/108

* cited by examiner

*Primary Examiner*—Robert Pascal
*Assistant Examiner*—Dylan White
(74) *Attorney, Agent, or Firm*—Patterson & Sheridan, LLP

(57) ABSTRACT

Techniques and circuits for ensuring one or more circuit components are not subjected to voltage levels above their rated voltage tolerance due to core logic and I/O logic supply voltages reaching final voltage levels at different times are provided. According to some embodiments, an internal voltage supply sense circuit may monitor a level of a voltage supply that powers core logic that generates control signals used to program a voltage regulator. In response to determining the core logic voltage supply is below a predetermined level, the sense circuit may generate one or more regulated voltage signals to override regulated voltage signals generated by the voltage regulator.

6 Claims, 10 Drawing Sheets

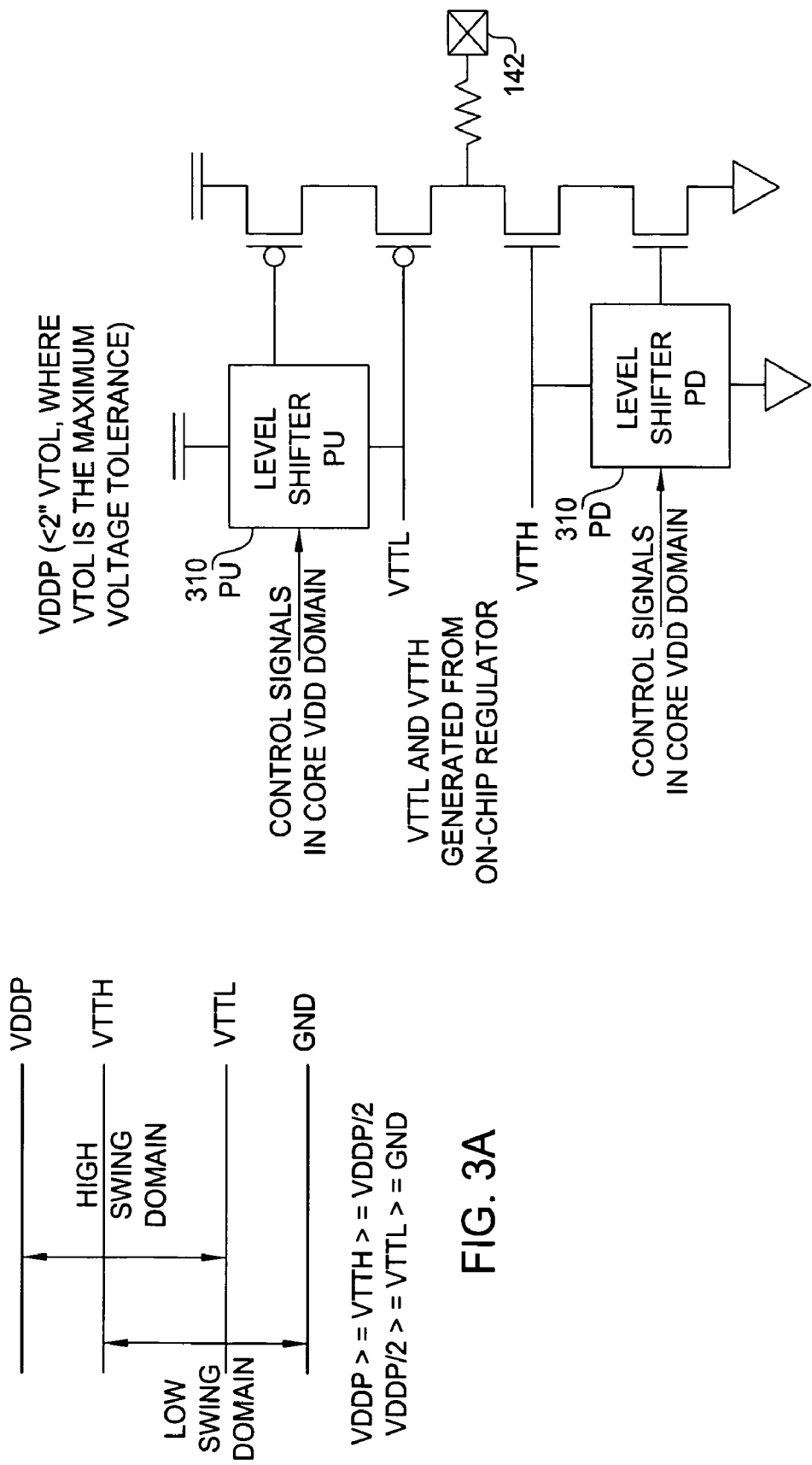

| VDDP STATE | VTTH | VTTL |
|---|---|---|
| 1.3 VTOL < VDDP < 2.0 VTOL | VDDP/2 | VDDP/2 |
| VTOL ≤ VDDP ≤ 1.3 VTOL | VDDP/2 < VTTH < .75 VDDP | VDDP/2 > VTTL > .25 VDDP |
| VDDP ≤ VTOL | VDDP | GND |

FIG. 4B

CIRCUIT TECHNIQUE TO PREVENT DEVICE OVERSTRESS

CROSS-REFERENCE TO RELATED APPLICATIONS

This application is related to co-pending U.S. patent application Ser. No. 11/299,081 entitled, "CIRCUIT TECHNIQUE TO ACHIEVE POWER UP TRISTATE ON A MEMORY BUS", filed herewith and incorporated herein in its entirety.

BACKGROUND OF THE INVENTION

1. Field of the Invention

This invention relates generally to computer systems and more specifically to a technique for ensuring circuit devices are not overstressed by operating voltages above their rated tolerance.

2. Description of the Related Art

In a typical processor device, such as a central processor unit (CPU) or graphics processing unit (GPU), different logic portions may be powered from different supply voltages. For example, in a GPU, core processing logic that processes data and generates command signals to external devices (e.g., memory devices) may be powered from a first supply voltage (e.g., VDD), while input output (I/O) logic that drives those command signals onto I/O pads may be powered from a second supply voltage (e.g., VDDP). In an effort to conserve power and increase operating frequency, the supply voltage used to power the core logic may be lower than the supply voltage used to power the I/O logic.

In some cases, I/O pad logic may include a programmable voltage regulator allowing operating voltages of I/O pad drivers to be adjusted, for example, to ensure optimal I/O performance. The regulator generates regulated voltages to the I/O drivers so that the allowable I/O power supply level can be extended. Signals from the core logic control may be used to program and configure the regulator so that regulated outputs are optimal levels.

Unfortunately, during power up or power down of the device, the I/O supply voltage may reach its final value while the core supply voltage is still ramping up or is completely off. Under such conditions, control signals supplied by the core logic to configure the programmable voltage controller may be at undefined logic levels. As a result, the regulator may be inadvertently configured in an unknown and, possibly, less than optimal manner. This situation may cause the regulated voltages output by the regulator and internal bias levels (inside of regulator) to be much higher than the maximum tolerance levels of these devices. This type of overstressing may lead to immediate or premature device failure.

In some conventional systems, this situation has been addressed by utilizing external components to ensure a proper power sequence is achieved. For example, circuit components may be arranged to ensure the core logic supply voltage supplied to the device has reached a final level before the I/O logic supply voltage is supplied to the device. However, this approach is also suboptimal as it adds components to the system bill of materials (BOMs) and increases overall cost and complexity.

Accordingly, what is needed is an improved technique to avoid the problems encountered when core logic and I/O logic supply voltages reach final voltage levels at different times.

SUMMARY OF THE INVENTION

Embodiments of the present invention generally provide methods and apparatus for preventing the application of voltages outside a rated tolerance to circuit components in an integrated circuit device.

One embodiment provides a method of controlling the level of voltage applied to one or more circuit components of an integrated circuit (IC) device having core logic powered by a first supply voltage and I/O logic powered by a second supply voltage. The method generally comprises determining if the first supply voltage is below a predetermined voltage level with a sense circuit, if the first supply voltage is not below the predetermined voltage level, supplying one or more regulated voltage signals to the one or more circuit components via a voltage regulator powered by the second supply voltage and configurable via control signals generated by the core logic, and if the first supply voltage is below the predetermined voltage level, supplying the one or more regulated voltage signals to the one or more circuit components via the sense circuit, wherein each of the regulated voltage signals has a voltage level below a rated tolerance voltage of the one or more circuit components.

Another embodiment provides an integrated circuit device generally including one or more input/output (I/O) pads, core logic powered by a first supply voltage and configured to generate one or more control signals, I/O logic powered by a second supply voltage and configured to drive control signals generated by the core logic onto the I/O pads, a voltage regulator and power sense logic. The voltage regulator is configured to generate regulated voltage signals supplied to circuit components in the I/O logic. The power sense logic configured to determine if the first supply voltage is below a predetermined voltage level and, if so, override the regulated voltage signals supplied to the circuit components in the I/O logic with regulated voltage signals generated by the power sense logic.

Another embodiment provides a computer system generally including one or more memory devices and at least one processor device having one or more input/output (I/O) pads coupled to the memory devices via a bus. The processor devices also includes core logic powered by a first supply voltage and configured to generate one or more control signals, I/O logic powered by a second supply voltage and configured to drive control signals generated by the core logic onto the I/O pads, a voltage regulator configured to generate regulated voltage signals supplied to circuit components in the I/O logic, and power sense logic. The power sense logic is configured to determine if the first supply voltage is below a predetermined voltage level and, if so, override the regulated voltage signals supplied to the circuit components in the I/O logic with regulated voltage signals generated by the power sense logic.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A and 3B illustrates an exemplary I/O pad final stage driver and regulated voltage diagram, respectively, in accordance with one embodiment of the present invention;

FIGS. 4A and 4B illustrate an exemplary voltage regulator and corresponding voltage table, in accordance with one embodiment of the present invention;

DETAILED DESCRIPTION

Embodiments of the present invention provide a technique for ensuring voltage levels outside a rated voltage tolerance are not inadvertently applied to I/O logic circuit components in an integrated circuit device due to core logic and I/O logic supply voltages reaching final voltage levels at different times. According to some embodiments, an internal voltage supply sense circuit may monitor a level of a voltage supply that powers core logic that generates control signals to configure an on-chip voltage regulator used to generate regulated voltages for the I/O logic. The sense circuit may generate one or more voltage bias signals used to keep the regulated voltages supplied to the I/O logic in a defined state even in the absence of core logic supply voltage.

As a specific, but not limiting example, one embodiment of the present invention provides a graphics processing unit (GPU) with an internal circuit that monitors core logic supply voltage and generates one or more bias voltages to keep regulated voltages supplied to I/O pad logic at a defined state even in the absence of adequate core logic supply voltage. However, those skilled in the art will recognize that the concepts described herein may be used to similar advantage in a variety of different devices, such as central processing units (CPUs) digital signal processors (DSPs), and the like, that utilize different supply voltages.

An Exemplary Graphics Subsystem

Figure 1:
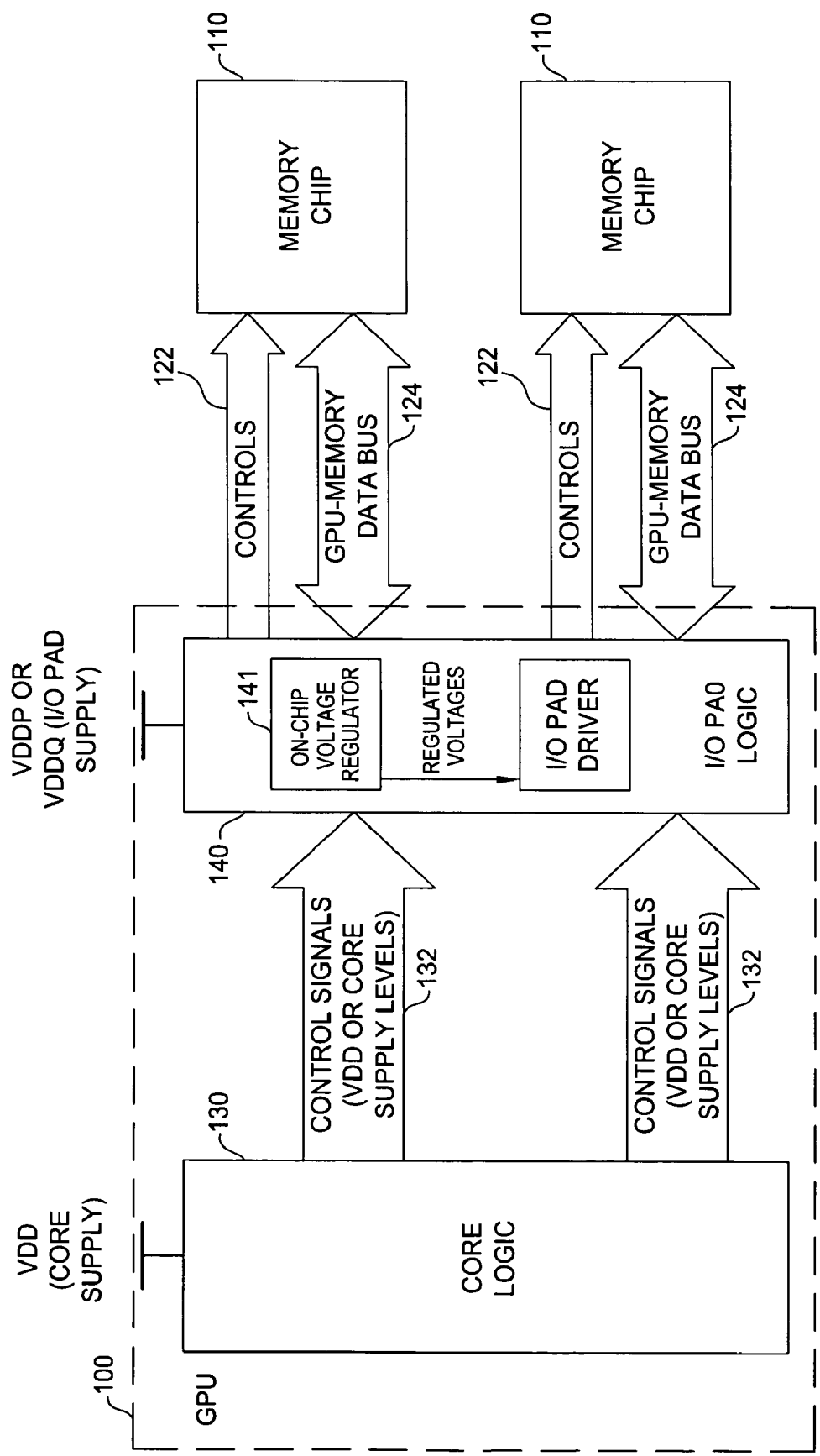
FIG. 1 illustrates an exemplary graphics subsystem with a graphics processing unit (GPU) in accordance with one embodiment of the present invention.

FIG. 1 illustrates an exemplary graphics subsystem 100, in which embodiments of the present invention may be used to advantage. As illustrated, a GPU 100 may access one or more memory chips 110 via control and data signals driven onto control bus 122 and data bus 124 coupled to a plurality of I/O pads (142 shown in FIG. 2) by I/O pad logic 140. The particular control and data signals driven onto the I/O pads may be generated by core logic 130 of the GPU 100. In other words, the core logic 130 may generate control and data signals 132 to be driven onto the I/O pads, for example, to read and write data to the memory devices 110.

While the data bus 124 between the GPU 100 and memory devices 110 is bi-directional, the control bus 122 typically includes one or more unidirectional data and command latching strobe (clock) signals. For example, clock enable (CKE) and chip select (CS) are very critical to the memory devices and are use to enable or disable the memory chips. In some cases, the combination of (high low) states of various other command signals may define particular commands. Accordingly, these control signals should be held in valid states whenever the memory devices are being used.

As illustrated, however, the core logic 130 may be powered from a different supply voltage (VDD) than the supply voltage used to power the I/O pad logic 140 (VDDP or VDDQ). As previously described, on system and/or device power up, the core logic supply voltage may ramp up slower than the I/O logic, resulting in a state where the I/O logic 140 may be functional before the core logic 130 is functional. In this state, it is possible that control signals originating from the core logic 130 may be in an undefined state. Driving these signals onto the command bus 122 by the I/O logic 140 may result in the inadvertent issuance of commands which could place the memory devices 110 in an inoperable state.

Further, control signals originating from the core logic 130 may also be used to configure an on-chip voltage regulator 141. The regulator 141 may be used to supply regulated voltage signals to I/O pad drivers 144. As previously described, when control signals originating from the core logic 130 are in an undefined state when the core supply voltage is low, for example, when the core supply voltage is ramping up or the device is in a low power state, it is possible the regulator 141 may be inadvertently configured in a manner that results in voltage levels beyond rated tolerance are applied to circuit components in the I/O logic.

Figure 2:
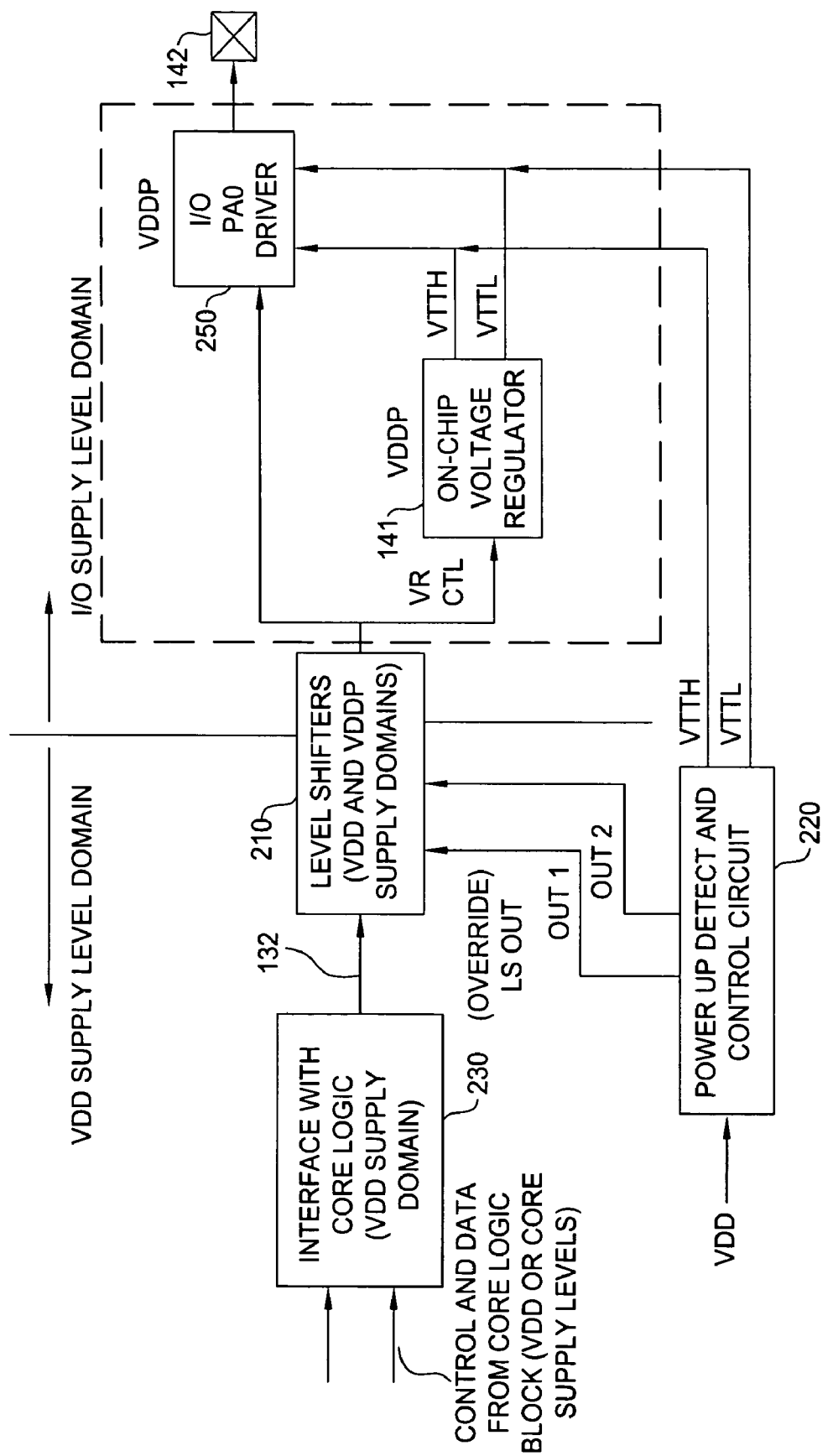
FIG. 2 illustrates an exemplary I/O pad block diagram in accordance with one embodiment of the present invention.

Therefore, in an effort to prevent overstressing of circuit components in the I/O logic, the GPU 100 may include a voltage supply sense circuit 220, as illustrated in the exemplary I/O pad block diagram of FIG. 2. As illustrated, the sense circuit 220 may monitor the level of the core logic supply voltage (VDD) and generate one or more signals to, in effect, disable the voltage regulator 141. The sense circuit 220 may override the regulated voltage signals provided by the voltage regulator 141 with bias voltage signals of a known level, within the rated tolerance of the I/O pad circuit components.

For some embodiments, the sense circuit may also generate one or more signals (e.g., OUT1 and OUT2) that may be used to control the output of level shifters 210. The level shifters 210 are used to convert signals from the core logic supply voltage domain (e.g., with logic swings from GND to VDD) to the I/O logic supply voltage domain (e.g., with logic swings from GND to VDDP). As will be described in greater detail below, the level shifters 210 may be configured to generate control signals to predriver logic circuits 240 and a final stage driver circuit 250 that result in a high impedance state of the output pad in an effort to ensure the memory devices 110 will not latch in any inadvertent command signals.

While only one I/O pad 142 is shown, those skilled in the art will appreciate that similar I/O pad logic 140 may be provided with each of a plurality of I/O pads 142 for the device 100. In some cases, different control signals may be provided to each different I/O pad. However, when the power up detect and control circuit 220 detects that the core logic voltage supply level is insufficient, the same signal states may be provided to each from the level shifters 210 in an effort to control the final stage driver 250 and place each output pad 142 corresponding to a particular control signal in a high impedance state.

Exemplary I/O Pad Driver Stage Protected from Overstress

The use of regulated voltages in the I/O pad logic is illustrated in FIG. 3A, which shows a final stage driver for an I/O pad 142. In response to a control signal supplied by the core logic, a pull-up level shifter circuit 310PU may generate an output voltage signal PU that swings between VDDP and a first regulated voltage level VTTL, to switch a pull-up transistor PM1. In a similar manner, a pull-down level shifter circuit 310PD may generate an output voltage signal PD that swings between a second regulated voltage level VTTH and GND, to switch a pull-down transistor NM1.

Thus, as illustrated in FIG. 3B, the pull-up components in the I/O pad logic (e.g., pull-up transistor PM1) will see a voltage potential of VDDP-VTTL, while the pull-down components in the I/O pad logic (e.g., pull-up transistor PN1) will see a voltage potential of VTTH-GND. Therefore, assuming a rated voltage tolerance VTOL, care should be taken to ensure that both potentials VDDP-VTTL and VTTH-GND do not exceed VTOL.

As previously described, however, the values of VTTH and VTTH may be adjustable via the programmable voltage regulator 141. Because the logic signals used to configure the voltage regulator 141 originate from the core logic side, it is possible to inadvertently configure the voltage regulator 141 to a setting that causes the voltage levels VTTH and/or VTTL to be set such that one or more of the potentials is above VTOL, depending on the value of VDDP. As will be described in greater detail below, for some embodiments, the sense circuit 220 may be configured to override the regulated voltage outputs, in response to detecting the core supply voltage has fallen below a threshold voltage level.

Exemplary Programmable Voltage Regulator

Figure 4A:
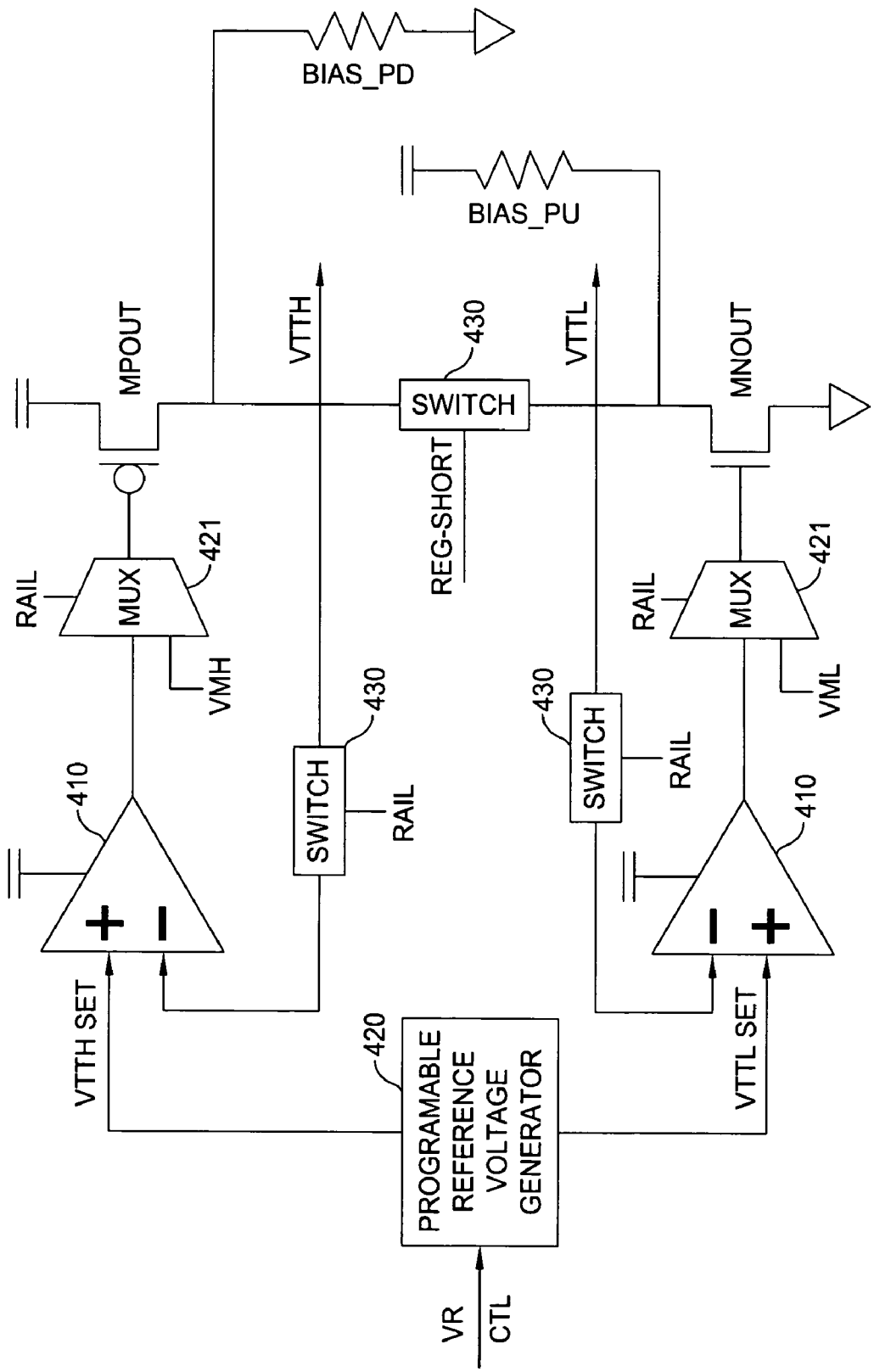

FIG. 4A illustrates an exemplary voltage regulator 141, in accordance with one embodiment of the present invention, utilizing an arrangement of negative feedback amplifiers. As illustrated, the values for the regulated voltage outputs may be independently controlled using a programmable reference voltage generator 420, which may be programmed via control signals VRCTL. The reference voltage generate 420 may comprise any suitable circuit elements to independently set the high and low regulated voltage levels, such as one or more resistive voltage divider circuits. For some embodiments, the voltage regulator 141 may be configured to operate in different modes, each designed to ensure the regulated output voltages do not result in voltages applied to circuit components in excess of their rated tolerance.

For some embodiments, the regulator 141 may operate in one of three different modes, as shown in FIG. 4B, depending on the level of VDDP. In the first mode, VDDP is at a relatively high level, between 1.3xVTOL and 2xVTOL. In this first mode, the regulated output nodes may be shorted (via switch 430$_1$), in order to bring the output nodes to a common voltage level, such as VDDP/2. Thus, even if VDDP is twice the rated voltage tolerance VTOL, no circuit components driven the regulated voltages will be subjected to a voltage in excess of VTOL.

In a second mode, VDDP may be at an intermediate level, between VTOL and 1.3xVTOL. In this second mode, the high regulated output VTTH may be brought higher (e.g., to 0.75VDDP) by the upper feedback amplifier 410U, while the low regulated output VTTL may be brought lower (e.g., 0.25VDDP) by the lower feedback amplifier. In a third mode, VDDP may be at a low below, below VTOL.

In this third mode, negative feedback may be disabled (by opening switches 420), while the regulated outputs VTTH and VTTL may be pulled up to VDDP (via pull-up transistor MPOUT) and pulled down to GND (via pull-down transistor MNOUT). As illustrated, the inputs to the transistors MNOUT and MPOUT may be controlled via muxes 420 that provide, as an output, either the output of the corresponding amplifier 410, or voltage signals (VMH and VML) designed to turn on the pull-up and pull-down transistors MPOUT and MNOUT. Thus, even when the I/O supply voltage VDDP is low, the circuit components may be protected from overvoltage conditions.

As previously described, with undefined (core logic generated) control signals, it may be possible to inadvertently set VTTH and/or VTTL to a value that results in overstress to one or more circuit components. Therefore, for some embodiments, the sense circuit 220 may be configured to monitor the core supply voltage level and, in response to detecting it is below a threshold value, generate voltage signals VTTH' and VTTL' to override the regulated voltage outputs supplied by the regulator 141.

Power Up Detect and Control Circuit

Figure 5A:
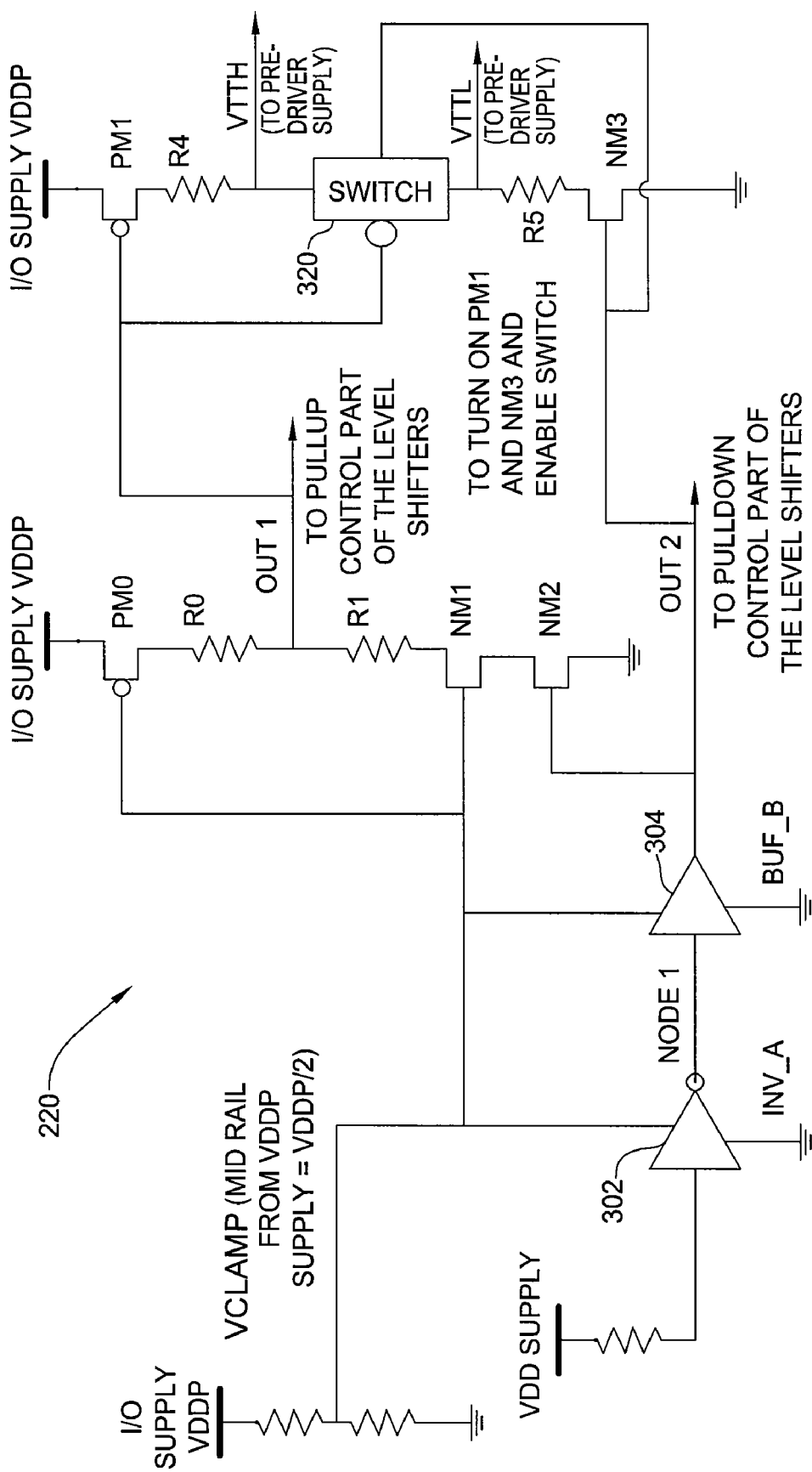
FIG. 5A illustrates a voltage supply sense circuit in accordance with one embodiment of the present invention.

FIG. 5A illustrates a voltage supply sense circuit 220 in accordance with one embodiment of the present invention, configured to generate voltage signals VTTH' and VTTL' to override regulated voltage signals generated by the regulator 141. As will be described herein, the sense circuit 220 may also generate output signals used to control pull-up and pull-down level shifters, and ensure these components generate signals that place output drivers in a high impedance state.

Figure 5B:
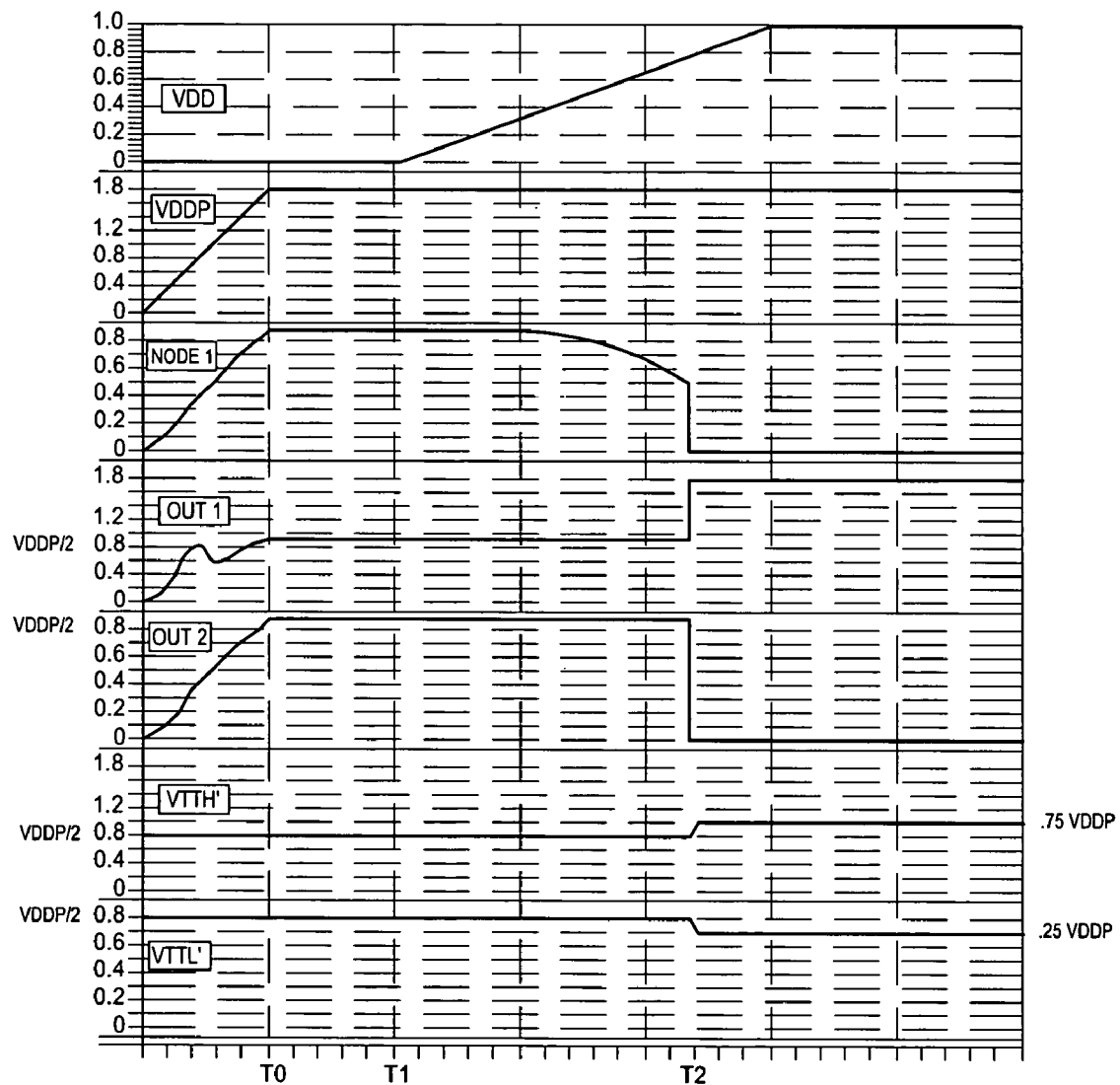
FIG. 5B illustrates an exemplary timing diagram of signals shown in FIG. 5A in accordance with one embodiment of the present invention.

Operation of the sense circuit 220 may be understood with simultaneous reference to FIG. 5B, which illustrates an exemplary timing diagram of signals shown in FIG. 5A. In the exemplary sequence shown in FIG. 5B, the I/O supply voltage VDDP has reached full level (at time T0), while the core logic supply voltage VDD has not yet begun to ramp up.

The sense circuit 220 includes an inverter 302 that receives, as an input, the core logic supply voltage VDD. The inverter 302 is powered from a voltage source that is set to a voltage level (VCLAMP) between VDDP and GND, for example, approximately midway (e.g., VDDP/2). Accordingly, when the core logic supply voltage VDD falls below the switching threshold of the inverter 302, the output of the inverter will swing from GND to VCLAMP.

As illustrated in FIG. 5B, with the core logic supply voltage VDD ramping up slowly (beginning at time T1), the output of the inverter 302 (labeled as Node 1) is initially at VCLAMP. Thus, the output of buffer 304 (and control signal OUT2) is also at VCLAMP, which is sufficient to switch on pull-down NMOS transistor NM2. Because the gates of pull-down NMOS transistor NM1 and pull-up PMOS transistor PM0 are both tied to VCLAMP, these transistors are both switched on continuously. With both NM1 and NM2 switched on, the first output (OUT1) will be pulled down. For some embodiments, the transistors (PM0, NM1, and NM2) and resistors (R0 and R1) may be sized to ensure the output OUT1 is approximately VCLAMP when NM2 is switched on (meaning there is inadequate core supply voltage VDD).

As will be described in greater detail below, OUT1 and OUT2 set at the intermediate voltage level VCLAMP may be used to override the normal function of the level shifters 210 and keep the final stage drivers of output pads 142 in a high impedance state. In any case, with OUT1 and OUT2 set at VCLAMP/2, switch 320, PM3 and NM3 may be turned on, bringing the bias output signals VTTH' and VTTL' to a common voltage level, such as VDDP/2 (depending on the values of R4, R5, and sizes of PM3 and NM3.

Once the core logic supply voltage rises to a sufficient level (at time T2), however, the output of inverter 302 will swing to GND, causing the output of buffer 304 (and OUT2) to swing to GND. As a result, pull-down NMOS transistor NM2 will turn off, thereby causing OUT1 to rise to the full level of the I/O supply voltage VDDP.

Prior to the core logic supply voltage rising to a sufficient level, the power sense logic may override the regulated voltage signals generated by the voltage regulator 141 (with signals VTTH' and VTTL') in the event inadvertent control signals from the core logic had programmed the voltage regulator in a manner that might result in the application of voltage levels to I/O pad logic components that are greater than their rated voltage tolerance. Once the core logic supply voltage has risen to a sufficient voltage level, the output nodes for VTTH' and VTTL' may then be placed in a high impedance state (by turning off PM3 and NM3), allowing the regulated voltages supplied by the regulator 141 to power the I/O pad logic. As an example, assuming the voltage regulator is operating in the second mode (with VTOL<VDDP<1.3xVTOL), with an intermediate voltage level for VDDP, VTTH and VTTL may be set to 0.75xVTOL and 0.25xVTOL.

The values of the control signals OUT1 and OUT2 with respect to the core logic supply voltage VDD is summarized in TABLE I below.

TABLE I

Control signal levels versus VDD supply

| VDD SUPPLY | NODE1 | OUT1 | OUT2 |
|---|---|---|---|
| LOW OR GRND | HIGH (VCLAMP) | HIGH (VCLAMP) | LOW (VCLAMP) |
| HIGHER OR VDD | LOW (GND) | HIGH (VDDP) | LOW (GND) |

Exemplary Level Shifters

Figure 6A:
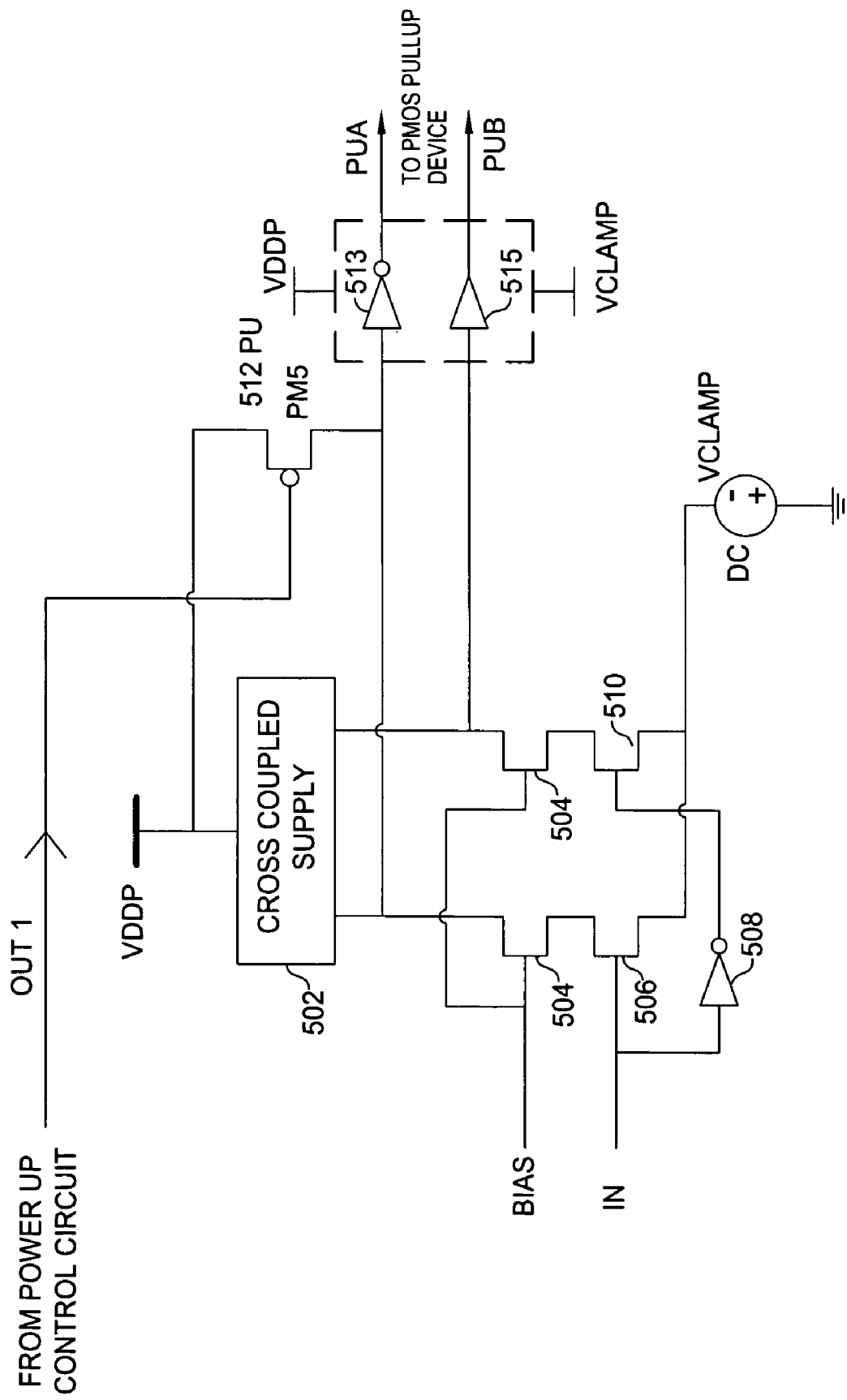
FIGS. 6A and 6B illustrated exemplary level shifters in accordance with one embodiment of the present invention.
Figure 6B:
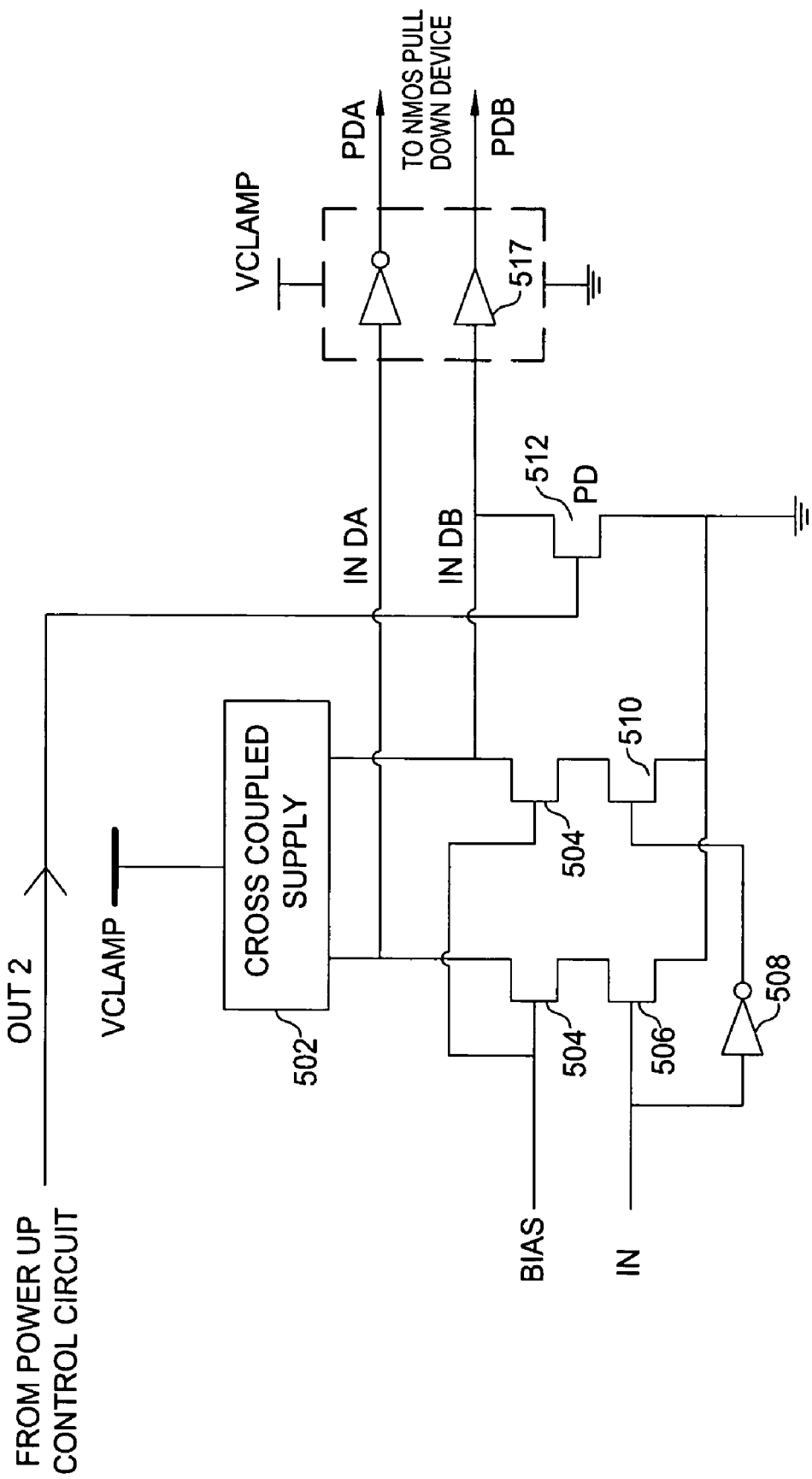

FIGS. 6A and 6B illustrated exemplary level shifters responsive to the control signals OUT1 and OUT2 generated by the sense circuit. In an effort to speed switching times (by reducing the total amount of swing during a signal transition), a pull-up level shifter (FIG. 5A) may be configured to have outputs that swing from VCLAMP (e.g., VDDP/2) to VDDP in response to an input signal supplied by core logic, while the other pull-down level shifter (FIG. 6B) may be configured to have outputs that swing from GND to VCLAMP.

Referring back to FIG. 6A, in a normal mode of operation (e.g., with sufficiently high VDD), the outputs of the pull-up level shifter PUA and PUB will operate in a complementary manner, with the state of each determined by the state of an input signal (IN) provided by the core logic. For example, if IN is high, transistor 506 will be switched on, pulling the input of buffer 513 and, thus PUA, low (VCLAMP). The high input will cause the output of inverter 508 to go low, turning off transistor 510, causing the input of buffer 515 to be pulled up through cross-coupled supply 502, bringing PUB high (VDDP). If IN switches to low, transistor 506 will turn off and transistor 510 will turn on, causing the outputs to toggle. The pull-down level shifter of FIG. 6B operates in a similar manner, however, with the outputs PDA and PDB toggling between GND and VCLAMP rather than VCLAMP and VDDP.

Figure 7C:
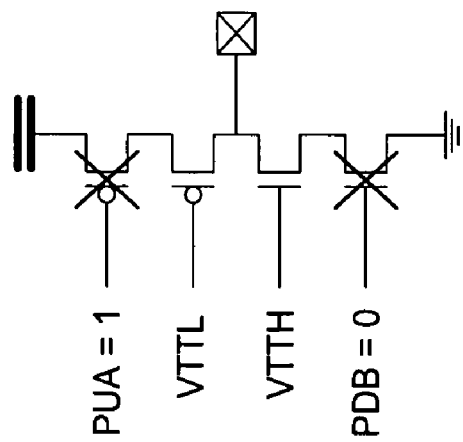
FIGS. 7A-7C illustrate an exemplary final stage driver for an output pad, in accordance with one embodiment of the present invention.
Figure 7B:
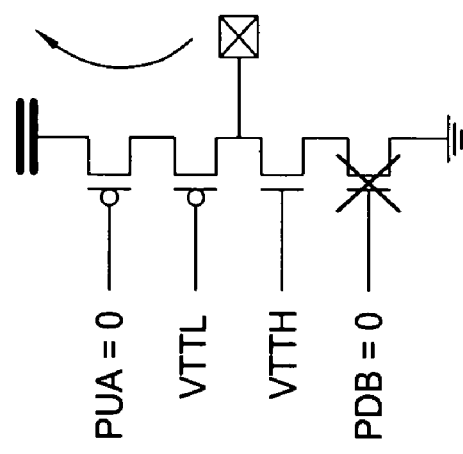
Figure 7A:
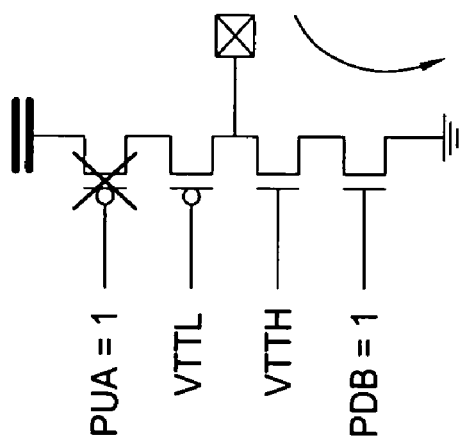

As illustrated in FIGS. 7A and 7B, one or more of the outputs of each of the pull-up and pull-down level shifters may be used to control a pull-up transistor PM1 and pull-down transistor NM3 in a simplified final stage driver 250. While a simplified final driver stage is shown with only one pull-up and only one pull-down transistor, those skilled in the art will recognize that more complex final stage drivers utilizing more than one pull-up transistor and/or more than one pull-down transistor may be used.

In any case, in the normal operating mode, for example, with IN high, PUA will be at VDDP and PDB will be at GND, turning off PM1 and turning on NM3, thus pulling the output pad 142 down to GND, as shown in FIG. 7A. In contrast, with IN low, PUA will be at VCLAMP and PDB will both be at GND, turning on PM1 and turning off NM3, thus pulling the output pad 142 up to VDDP, as shown in FIG. 7B.

However, when the core logic supply level is low, and the sense circuit 220 drives OUT1 and OUT2 to VCLAMP, the input signal IN to the level shifter circuits is overridden. Referring back to FIG. 6A, when OUT1 is set to VCLAMP, pull-up transistor 512PU is switched on, keeping the input to buffer 513 and PUA pulled high. As a result, the output PUA is kept high (VDDP). It should be noted that with the core logic supply voltage low, the input signal IN will also be low and there will be no contention due to pulling down as transistor 506 will be turned off. Referring now to FIG. 6B, when OUT2 is set to VCLAMP, pull-down transistor 512PD is switched on, keeping the input to buffer 517 and PDB pulled down. With PUA pulled up and PDB pulled down, both transistors PM1 and NM3 will be switched off, thus keeping the output pad 142 in a high impedance state, as shown in FIG. 7C.

As described above, the regulated supply voltages VTTH and VTTL used to power circuit components in FIGS. 7A-7C, may be selected in a manner to optimize I/O performance. However, should the core supply voltage fall below a particular voltage tolerance, the power sense circuit 220 may be configured to generate voltage signals to override the regulated voltage signals provided by the generator 140.

CONCLUSION

By detecting when the level of supply voltage used to power core logic that generates control signals to be driven out on output pads with logic powered by a different supply voltage, embodiments of the present invention may be able to prevent the application of voltage levels to circuit components in I/O pads. As a result, even while the core logic supply voltage is low and control signals used to configure the regulator are undefined, embodiments of the present invention may override regulated voltage outputs generated by the regulator to ensure voltages in excess of rated tolerance are not exceeded.

While the foregoing is directed to embodiments of the present invention, other and further embodiments of the invention may be devised without departing from the basic scope thereof, and the scope thereof is determined by the claims that follow.

The invention claimed is:

1. A method of controlling the level of voltage applied to one or more circuit components of an integrated circuit (IC) device having core logic powered by a first supply voltage and I/O logic powered by a second supply voltage, comprising:

determining if the first supply voltage is below a predetermined voltage level with a sense circuit by receiving the first supply voltage as an input to a logic circuit powered from an intermediate supply voltage having a voltage level between ground and the second supply voltage;

if the first supply voltage is not below the predetermined voltage level, supplying one or more regulated voltage signals to the one or more circuit components via a voltage regulator powered by the second supply voltage and configurable via control signals generated by the core logic, including:

supplying a high regulated voltage signal to switch a transistor in a pull-down circuit; and supplying a low regulated voltage signal to switch a transistor in a pull-up circuit, wherein the pull-down and pull-up circuits are used to drive an input/output (I/O) pad of the IC device and values of the high and low regulated voltage signals are dependent, at least in part, on control signals generated by the core logic that are used to configure a programmable reference voltage generator; and if the first supply voltage is below the predetermined voltage level, supplying the one or more regulated voltage signals to the one or more circuit components via the sense circuit, wherein each of the regulated voltage signals has a voltage level below a rated tolerance voltage of the one or more circuit components, and the one or more regulated voltage signals supplied by the sense circuit have a substantially similar voltage level that is approximately one half the voltage level of the second supply voltage.

2. An integrated circuit device, comprising:

one or more input/output (I/O) pads;

core logic powered by a first supply voltage and configured to generate one or more control signals;

I/O logic powered by a second supply voltage and configured to drive control signals generated by the core logic onto the I/O pads;

a voltage regulator configured to generate regulated voltage signals supplied to circuit components in the I/O logic, wherein the regulated voltage signals include high and low regulated voltage signals; and power sense logic configured to determine if the first supply voltage is below a predetermined voltage level and, if so, override the regulated voltage signals supplied to the circuit components in the I/O logic with regulated voltage signals generated by the power sense logic, wherein the power sense logic comprises a logic circuit that receives the first supply voltage as an input, the logic circuit powered from an intermediate supply voltage having a voltage level between ground and the second supply voltage, wherein the voltage regulator comprises a programmable voltage reference configurable by the core logic to independently set voltage levels of the regulated voltage signals supplied by the voltage regulator, wherein the I/O logic comprises I/O pad drivers having transistors switched by the high and low regulated voltage signals, wherein a first level shifting circuit generates control signals that swing between the low regulated supply voltage level and the second supply voltage, and wherein a second level shifting circuit generates control signals that swing between a ground level and the high regulated voltage level.

3. The integrated circuit device of claim 2, wherein:

the voltage regulator is configured to generate the high regulated voltage signal at or near the second supply voltage level and to generate the low regulated voltage signal at or near ground if the second supply voltage is at or below a rated voltage tolerance of the one or more circuit components; and the voltage regulator is configured to generate the high and low regulated voltage signals both at or near one half the second supply voltage level if the second supply voltage is above the rated voltage tolerance of the one or more circuit components by a predetermined amount.

4. The integrated circuit device of claim 3, wherein the voltage regulator is configured to generate the high and low regulated voltage signals based on values of the programmable voltage reference if the second supply voltage level is above the rated voltage tolerance but below the rated voltage tolerance by the predetermined amount.

5. A computer system, comprising:

one or more memory devices; and at least one processor device having one or more input/output (I/O) pads coupled to the memory devices via a bus, core logic powered by a first supply voltage and configured to generate one or more control signals, I/O logic powered by a second supply voltage and configured to drive control signals generated by the core logic onto the I/O pads, a voltage regulator configured to generate regulated voltage signals supplied to circuit components in the I/O logic, and power sense logic configured to determine if the first supply voltage is below a predetermined voltage level and, if so, override the regulated voltage signals supplied to the circuit components in the I/O logic with regulated voltage signals generated by the power sense logic, wherein the voltage regulator is configured to generate the high regulated voltage signal at or near the second supply voltage level and to generate the low regulated voltage signal at or near ground if the second supply voltage is at or below a rated voltage tolerance of the one or more circuit components, and wherein the voltage regulator is configured to generate the high and low regulated voltage signals both at or near one half the second supply voltage level if the second supply voltage is above the rated voltage tolerance of the one or more circuit components by a predetermined amount.

6. The computer system of claim 5, wherein the voltage regulator is configured to generate the high and low regulated voltage signals based on values of the programmable voltage reference if the second supply voltage level is above the rated voltage tolerance but below the rated voltage tolerance by the predetermined amount.

* * * * *